[19] United States Patent
Langley

[11] Patent Number: 4,939,105
[45] Date of Patent: Jul. 3, 1990

[54] PLANARIZING CONTACT ETCH

[75] Inventor: Rod C. Langley, Boise, Id.

[73] Assignee: Micron Technology, Inc., Boise, Id.

[21] Appl. No.: 388,841

[22] Filed: Aug. 3, 1989

[51] Int. Cl.$^5$ .................. H01L 21/00; H01L 21/02; H01L 21/283; H01L 21/302
[52] U.S. Cl. ..................... 437/228; 437/225; 437/235; 437/981; 148/DIG. 51; 148/DIG. 131; 156/643; 156/644; 156/646
[58] Field of Search ............. 437/189, 195, 225, 228, 437/235, 981; 148/DIG. 51, DIG. 131; 204/192.32, 192.24, 192.37; 156/643, 646, 653, 657, 659.1

[56] References Cited
U.S. PATENT DOCUMENTS
4,520,041  5/1985  Aoyama et al. .................... 437/195
FOREIGN PATENT DOCUMENTS
0160126  8/1985  Japan ........................ 148/DIG. 161

OTHER PUBLICATIONS
Sze, S., VLSI Technology, pp. 317-321, McGraw-Hill, 1983.

Primary Examiner—Brian E. Hearn
Assistant Examiner—B. Everhart
Attorney, Agent, or Firm—Jon Paul Busack; Stan Protigal; Angus C. Fox

[57] ABSTRACT

The present invention is a contact etch method which simultaneously smoothes a reflowed oxide profile so that separate phanarization photoresist coat and etch steps are unnecessary. This method is characterized in that it is fast, uses only one photoresist mask layer, etches contacts to poly and to substrate simultaneously, is done entirely with plasma etch technology in a single reactor, and builds up less polymer in the plasma reactor. The novel method eliminates a coat and an etch step, improving yield and reducing fabrication time. Lower polymer buildup means higher yields due to a cleaner process, and less downtime for reactor chamber cleaning.

15 Claims, 2 Drawing Sheets

PLANARIZING CONTACT ETCH

BACKGROUND OF THE INVENTION

1. Field of the Invention

The present invention relates to etching methods used in the fabrication of integrated electronic circuits in a semiconductor substrate such as silicon, particularly a combined contact etch and planarization in a single mask process.

An electronic circuit is chemically and physically integrated into a substrate such as a silicon wafer by patterning regions in the substrate, and by patterning layers on the substrate. These regions and layers can be conductive, for conductor and resistor fabrication, or insulative, for insulator and capacitor fabrication. They can also by of differing conductivity types, which is essential for transistor and diode fabrication. Degrees of resistance, capacitance, or conductivity are controllable, as are the physical dimensions and locations of the patterned regions and layers, making circuit integration possible. Fabrication can be quite complex and time consuming, and therefore expensive. It is thus a continuing quest of those in the semiconductor fabrication business to reduce fabrication times and costs of such devices in order to increase profits. Any simplified processing step or combination of processes at a single step becomes a competitive advantage.

2. Description of the Related Art

A situation where a process simplification is desirable is in dielectric ("oxide") planarization and contact etch steps, particularly for contacts 1.2 microns or less across. Planarization is necessary because the distance between the valleys and peaks in the oxide is so large that a subsequent layer such as photoresist ("resist") or metal is difficult to pattern due to differences in focusing and exposure requirements between the peaks and valleys, due to different elevations, and due to the tendency for the subsequenct layer to thin out at the peaks and pool in the valleys. "Contact etch" refers to the etching of holes, or contacts, through an intermediate layer such as oxide, so that a conductive layer such as metal on top of the insulative oxide can contact a layer underneath the oxide.

"Reflow", where a layer of oxide is heated sufficiently to cause it to smooth out, provides a degree of planarization. This technique along is not always satisfactory because the high temperature required for adequate reflow may also affect the semiconductor structures under fabrication.

Plasma or "dry" etching is an ideal technology for performing both planarization and contact etch. Plasma offers easy control of the resist-to-oxide etch rate ratio, ideally 1:1 for planarization. Plasma also offers anisotropic etchability, appropriate for making contact walls vertical, which is desirable. A camber or slope in the upper contact wall may also be desirable, to allow easy flow of a subequent layer into the contact during deposition. This slope can be done using plasma techniques or by well known chemical or "wet" etch methods.

Conventionally, an oxide layer is first planarized and then contacts are etched in the oxide before a subsequent metal deposition. In planarization, resist is layered on oxide, as illustrated in FIG. 1, and then etched back at a 1:1 etch rate ratio (resist to oxide), as shown in FIG. 2. Contact etch is done by patterning a mask of resist on the oxide, isotropically etching to slope the contacts, and then finishing with a more anisotropic etch to produce near-vertical slope near the bottom of the contact. The resist is then stripped and the wafer stands ready as shown in FIG. 3 for metal deposition. Although both of these etches can be done dry, the isotropic etch step is often done wet.

It is desirable to perform planarization and contact etch using one resist mask layer instead of two. It is further desirable to perform this entirely by dry etching.

SUMMARY OF THE INVENTION

The present invention is a contact etch method which simultaneously smoothes a reflowed oxide profile so that separate planarization photoresist coat and etch steps are unnecessary. This method is characterized in that it is fast, uses only one photoresist mask layer, etches contacts to poly and to substrate simultaneously, is done entirely with plasma etch technology in a single reactor, and builds up less polymer in the plasma reactor. Using a single photoresist mask layer eliminates a coat and an etch step, improving yield and reducing fabricating time. Lower polymer buildup means higher yields due to a cleaner process, and less downtime for reactor chamber cleaning.

In the inventive method, a reflowed layer of oxide over polycrystalline silicon ("poly") structures is masked with patterned resist. A first etch step is performed, which slopes the resist and begins etching exposed oxide. As the resist erodes, more oxide is exposed to the etching atmosphere and therefore the top of the contact is widened, or "sloped". The amount of resist erosion is critical, as it serves to ultimately define the desired contact profile or slope. In a second step, resist and oxide are etched at approximately a 1:1 etch rate ratio until poly is, or nearly is, exposed. A third, nonselective, etch step is then performed. Although some of the poly is etched where it is exposed in the shallow contacts, full poly thickness is not needed in this structure. Furthermore, this step has the advantages of being faster and producing less polymer than with a more selective etch. When a predermined maximum allowable amount of poly has been lost, a fourth and final etch step is performed, reactive to oxide more than poly, to clear remaining oxide from deep contacts without removing much more poly.

BRIEF DESCRIPTION OF THE DRAWINGS

The inventive method will be more apparent from the description of the preferred embodiment set forth below, with reference to the accompanying sectional drawings, in which.

DETAILED DESCRIPTION OF THE PREFERRED EMBODIMENT

Figure 1:
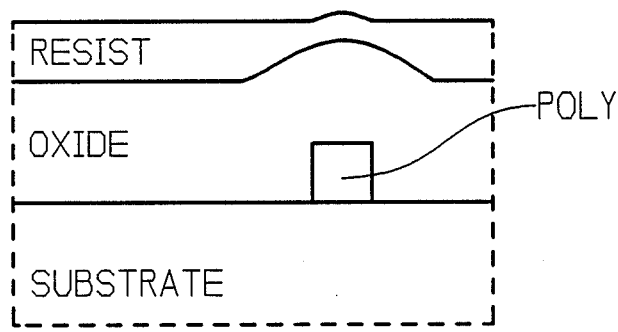
FIG. 1 shows oxide coated with resist just prior to a conventional planarization etch.
Figure 2:
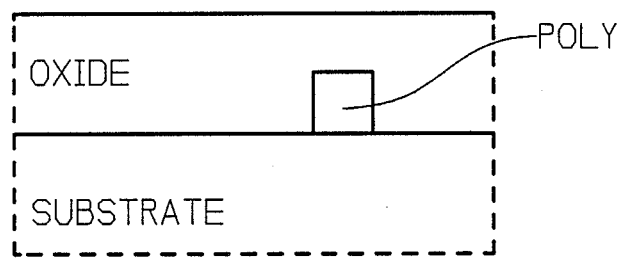
FIG. 2 shows the oxide layer after a conventional planarization etch.
Figure 3:
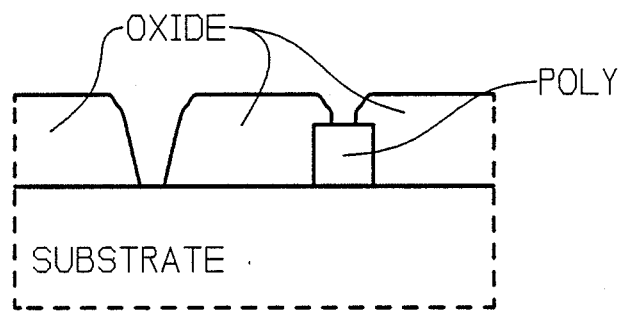
FIG. 3 shows the result after a conventional contact etch.
Figure 4:
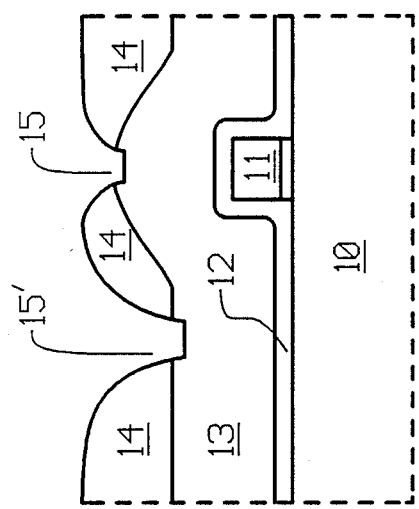
FIG. 4 depicts a patterned contact mask on top of a reflowed oxide layer.

As illustrated in FIG. 4, a preferred embodiment of the inventive method is well suited to etch planarized contacts in 15 kÅ of borophosphosilicate oxide (BPSG) 13, over a 1.5 kÅ barrier layer of tetraethylorthosilicate derived oxide (TEOS) 12, over 5.5 kÅ poly structures 11, the BPSG layer 13 having a 10.5 kÅ mask layer of resist 14 which is patterned for contacts 15 and 15'. After the inventive process is performed, contacts 15 open to poly 11, and contacts 15' open to silicon substrate 10.

In this structure, BPSG layer 13 has preferably previously undergone reflow to achieve partial improvement in planarization. Reflow is well understood in the art and therefore not detailed herein. TEOS barrier layer 12 acts to block boron and phosphorus from diffusing into poly 11 from BPSG 13 during said reflow. Resist 14 openings for contacts 15 and 15' of about 0.8 microns across will result in final measurements of about 1.2–1.4 microns across the bottom of contacts 15 and 15'. Contacts 15 and 15' will have a preferred slope of about 60° from horizontal near their tops, although slopes of about 45°–75° can be achieved by variations in step one of the inventive process.

The preferred method includes four timed etch steps in a single Lam 790 parallel plate plasma etch reactor, having an inert cathode such as anodized aluminum, and an anode on which substrate 10 is mounted. All four steps utilize a 0.36–0.5 cm gap between reactor electrodes, a 2.0–2.8 torr chamber pressure, and about 1.54–3.39 W/cm$^2$ plasma power density, although approximately 0.46 cm, 2.3 torr, and 2.78 W/cm$^2$ are preferred.

Figure 5:
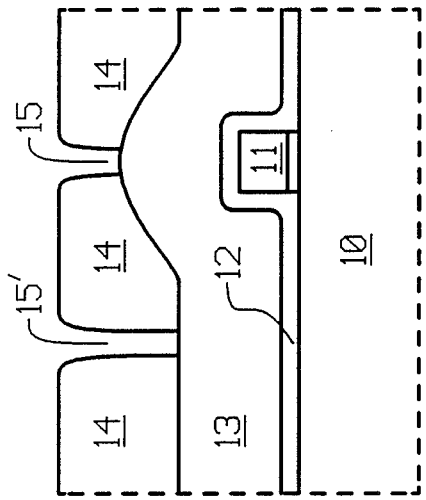
FIG. 5 shows the result of the first step of the inventive method, which widens the contacts.

In the first step, a chamber atmosphere of $O_2$, He, $CHF_3$, and $CF_4$ is provided, widening, or forming slopes in, contacts 15 and 15' by eroding resist 14. This etch step is timed at about 45 seconds for a preferred slope, after which the structure appears as shown in FIG. 5. The atmosphere includes 5–20 sccm $O_2$, 0–200 sccm He, 0–30 sccm $CHF_3$, and 75–200 sccm $CF_4$, although 10 sccm, 140 sccm, 15 sccm, and 125 sccm, respectively, are preferred. In this disclosure, "sccm" denotes a flow of standard cubic centimeters per minute, injected into the plasma through holes in the cathode.

Figure 6:
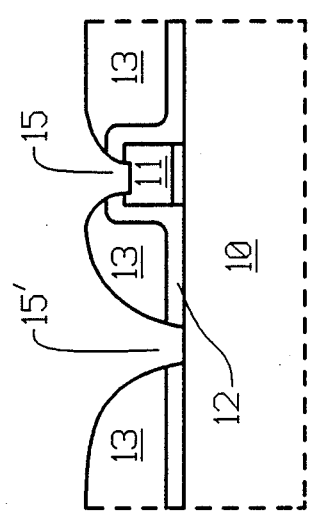
FIG. 6 shows the result of the second step of the inventive method, an etch down to poly.

After the proper contact slope is obtained, a second etch is performed, the chamber atmosphere including about 140 sccm He, 15 sccm $CHF_3$, and 125 sccm $CF_4$, in order to etch oxides 13 and 12 and remaining resist 14 at a 1:1 etch rate ratio. This etch is carefully timed at about 30 seconds, although up to 45 seconds has successfully been done, stopping at or just before poly 11 is exposed. Preferably, resist 14 clears at about the same time that poly 11 is exposed, at which point the structure appears as shown in FIG. 6. Notice that contacts 15 are essentially complete at this point. Although the preferred gas flows are given, they can range within approximately 0–200 sccm for He, 0–30 sccm for $CHF_3$, and 75–200 sccm for $CF_4$.

The third etch step in the inventive process includes at atmosphere of about 120 sccm He, 20 sccm $CHF_3$, and 50 sccm $CF_4$, to quickly and cleanly etch most of the remaining oxide out of contacts 15'. This etch is timed at about 45–60 seconds, preferably 60, and is nonselective to reduce etch time and polymer formation, thus producing a faster, cleaner process. It is true that this third step will etch more of poly 11 than a similar, more selective etch, but the structure etched by the preferred method does not require full poly 11 thickness, and the etch step is stopped before too much poly is etched away. In this step, the gas flows can range within about 0–200 sccm for He, 10–30 sccm for $CHF_3$, and 25–75 sccm for $CF_4$, as long as more $CF_4$ is provided than $CHF_3$.

The fourth and final step in the preferred method is selective, simply etching remaining oxide out of contacts 15' down to substrate, without etching much poly 11 out of contacts 15. This etch step is similar to the third etch step, except the amount of $CHF_3$ relative of $CF_4$ is increased to provide selectivity. The chamber atmosphere includes about 0–200 sccm He, 30–60 sccm $CHF_3$, and 25–75 sccm $CF_4$, there being more $CF_4$ provided than $CHF_3$. About 120 sccm He, 45 sccm $CHF_3$, and 50 sccm $CF_4$ are preferred. This etch is timed at about 90–150 seconds, prefereably 90 for the given structure.

Figure 7:
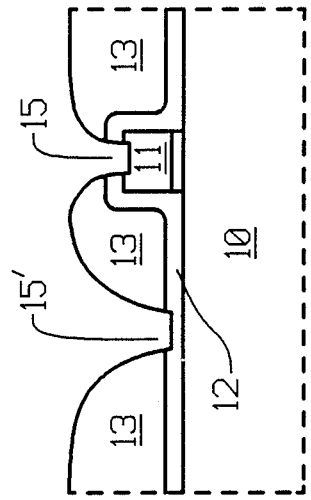
FIG. 7 shows the result of the third and fourth steps of the inventive method, an etch clearing all oxide from the contacts.

FIG. 7 illustrates the final result of the inventive etch. Notice that contacts 15 and 15' are well sloped at their tops, and deeper contacts 15' have vertical or near-vertical walls.

Clearly, because the inventive method reduces oxide and poly thicknesses, original layer thicknesses of a given structure must be predetermined based on anticipated removal to obtain desired final thicknesses. Although timed etches are preferred, it is recognized among those skilled in plasma etch that exact times will vary for given plasma etch reactors, semiconductor structures, and film compositions (for example, BSG or PSG vs. BPSG, or poly doping variations). It is known that endpoints can often be used as an alternative to timed etches. This etch may also be interrupted at some intermediate layer between oxide and substrate, instead of stopping at substrate. The fact that poly may or may not rest on gate oxide is trivial to this process. These variations and others are intended to be circumscribed by these claims.

I claim:

1. A planarizing contact etch method, for a semiconductor structure including a first layer of oxide over a patterned second layer of poly over a substrate, comprising the steps of:
   (a) masking the semiconductor structure with resist patterned for first and second groups of contacts, a contact of said first group located over poly, and a contact of said second group located over substrate;
   (b) providing a parallel plate plasma etch reactor, having a first electrode whereon the substrate is mounted, and having an inert second eletrode;
   (c) performing a first plasma etch on the semicondictor structure while it is in a first atmosphere including approximately 5 to 20 sccm $O_2$, 0 to 200 sccm He, 0 to 30 sccm $CHF_3$, and 75 to 200 sccm $CF_4$, until contacts of said first and second groups are sufficiently sloped;
   (d) performing a second plasma etch on the semiconductor structure while it is in a second atmosphere including approximately 0 to 200 sccm He, 0 to 30 sccm $CHF_3$, and 75 to 200 sccm $CF_4$, until a contact of said first group is etched to, or nearly to, poly;
   (e) performing a third plasma etch on the semiconductor structure while it is in a third atmosphere including approximately 0 to 200 sccm He, 10 to 30 sccm CHF$_3$, and 25 to 75 sccm CF$_4$, there being more CF$_4$ provided than CHF$_3$, to quickly etch oxide out of a contact of said second group, until a predetermined limit of poly has been etched out of a contact of said first group; and (f) performing a fourth plasma etch on the semiconductor structure while it is in a fourth atmosphere including approximately 0 to 200 sccm He, 30 to 60 sccm CHF$_3$, and 25 to 75 sccm CF$_4$, there being more CF$_4$ provided than CHF$_3$, until a contact of said second group is etched to substrate.

2. The method of claim 1, wherein a gap within approximately 0.36 to 0.5 cm exists between said first and second electrodes during at least one of said plasma etches.

3. The method of claim 1, wherein a gap of approximately 0.46 cm exists between said first and second electrodes during at least one of said plasma etches.

4. The method of claim 1, wherein at least one of said atmospheres has a pressure within approximately 2.0 to 2.8 torr.

5. The method of claim 1, wherein at least one of said atmospheres has a pressure of approximately 2.3 torr.

6. The method of claim 1, wherein at least one of said plasma etches utilizes a plasma power density within approximately 1.54 to 3.39 W/cm$^2$.

7. The method of claim 1, wherein at least one of said plasma etches utilizes a plasma power density of approximately 2.78 W/cm$^2$.

8. The method of claim 1, wherein said first atmosphere includes approximately 10 sccm O$_2$, 140 sccm He, 15 sccm CHF$_3$, and 125 sccm CF$_4$.

9. The method of claim 1, wherein said second atmosphere includes approximately 140 sccm He, 15 sccm CHF$_3$, and 125 sccm CF$_4$.

10. The method of claim 1, wherein said third atmosphere includes approximately 120 sccm He, 20 sccm CHF$_3$, and 50 sccm CF$_4$.

11. The method of claim 1, wherein said fourth atmosphere includes approximately 120 sccm He, 45 sccm CHF$_3$, and 50 sccm CF$_4$.

12. A planarizing contact etch method, for a semiconductor structure including a first layer of oxide over a patterned second layer of poly over a silicon substrate, comprising the steps of:

(a) masking the semiconductor structure with resist patterned for first and second groups of contacts, a contact of said first group located over poly, and a contact of said second group located over substrate;

(b) providing a parallel plate plasma etch reactor, having a first electrode whereon the substrate is mounted, and having an inert second electrode;

(c) peroforming a first plasma etch on the semiconductor structure while it is in a first atmosphere including approximately 10 sccm O$_2$, 140 sccm He, 15 sccm CHF$_3$, and 125 sccm CF$_4$, to etch said resist and the first layer until contacts of said first and second groups are sufficiently sloped;

(d) performing a second plasma etch on the semiconductor structure while it is in a second atmosphere including approximately 140 sccm He, 15 sccm CHF$_3$, and 125 CF$_4$, until a contact of said first group etches to, or nearly to, poly;

(e) performing a third plasma etch on the semiconductor structure while it is in a third atmosphere including approximately 120 sccm He, 20 sccm CHF$_3$, and 50 sccm CF$_4$, to quickly etch oxide out of a contact of said second group, until a predetermined limit of poly has been etched out of a contact of said first group; and (f) performing a fourth plasma etch on the semiconductor structure while it is in a fourth atmosphere including approximately 120 sccm He, 45 sccm CHF$_3$, and 50 CF$_4$, until a contact of said second group is etched to substrate.

13. The method of claim 12, wherein said resist has a thickness such that it clears at approximately the same time that said second plasma etch is complete.

14. The method of claim 12, wherein the oxide layer includes at least one of the group of oxide, BPSG, PSG, BSG, and TEOS.

15. The method of claim 12, wherein the oxide layer is previously reflowed.

* * * * *

UNITED STATES PATENT AND TRADEMARK OFFICE
CERTIFICATE OF CORRECTION

PATENT NO. : 4,939,105
DATED : July 3, 1990
INVENTOR(S) : Rod C. Langley

It is certified that error appears in the above-indentified patent and that said Letters Patent is hereby corrected as shown below:

```
    Column 1, line 15, delete "by" and insert -- be --;

Column 4, line 44, delete "pattered" and insert
-- patterned --;

Column 4, line 53, delete "eletrode" and insert
-- electrode --;

Column 6, line 11, delete "peroforming" and insert
-- performing --.
```

Signed and Sealed this

Sixteenth Day of November, 1993

Attest:

BRUCE LEHMAN

*Attesting Officer*    *Commissioner of Patents and Trademarks*